United States Patent [19]

Parenti et al.

[11] Patent Number: 4,489,390
[45] Date of Patent: Dec. 18, 1984

[54] SPATIAL FILTER SYSTEM

[75] Inventors: Ronald R. Parenti, Acton; William E. Keicher, Burlington, both of Mass.

[73] Assignee: Massachusetts Institute of Technology, Cambridge, Mass.

[21] Appl. No.: 245,894

[22] Filed: Mar. 20, 1981

[51] Int. Cl.³ .............................................. G01S 7/30
[52] U.S. Cl. .................................................... 364/724
[58] Field of Search ...................... 364/724, 862, 819; 356/310, 71; 333/165; 358/283

[56] References Cited

U.S. PATENT DOCUMENTS

| | | | |
|---|---|---|---|
| 3,971,922 | 7/1976 | Bellanger et al. | 364/724 |
| 3,997,973 | 12/1976 | Buss | 364/862 |
| 4,045,795 | 8/1977 | Fletcher et al. | 364/819 |
| 4,092,618 | 5/1978 | Guidoux | 364/724 |
| 4,194,221 | 4/1980 | Stoffel | 358/283 |
| 4,264,983 | 4/1981 | Miller | 364/862 |
| 4,267,580 | 1/1979 | Bond et al. | 364/862 |

OTHER PUBLICATIONS

Sakaue, "An Input-Weighted CCD Transversal Filter", 1977, pp. 391–396.
J. J. Otazo, E. W. Tung and R. R. Parenti, "Digital Filters for Infrared Target Acquisition Sensors", SPIE, Smart Sensors, (1980).
J. J. Otazo and R. R. Parenti, "Digital Filters for the Detection of Resolved and Unresolved Targets Embedded in IR Scenes," Proceedings of the SPIE Technical Symposium East, (Apr. 1979), Smart Sensors, vol. 178, p. 13ff.
J. T. Carlo and J. E. Hall, "Spatial Filtering Using 3x3 Kernal Convolutions," SPIE, vol. 178, Smart Sensors, (1979), pp. 154–161.

Primary Examiner—Gareth D. Shaw
Assistant Examiner—T. Wiens
Attorney, Agent, or Firm—Arthur A. Smith, Jr.; Thomas J. Engellenner

[57] ABSTRACT

A spatial filter system for filtering a matrix of data values by an m×n matrix, where the m×n matrix is the product of a 1×n matrix and a m×a matrix. The system includes a first spatial filter adapated to filter each row of the data matrix with the 1×m matrix to provide a first filtered value matrix. The system also includes a second spatial filter adapted to filter each column of the first filtered value matrix with the m×1 matrix to provide a second filtered value matrix.

6 Claims, 1 Drawing Figure

SPATIAL FILTER SYSTEM

The Government has rights in this invention pursuant to Contract Number AF19(628)-80-C-0002 awarded by the U.S. Department of the Air Force.

BACKGROUND OF THE INVENTION

The present invention is in the field of data processing, and more particularly relates to linear spatial filter systems.

Spatial filters are known in the art to be very effective in the restoration and enhancement of digitized images. Moreover, two dimensional linear matched filtering as a technique has been recognized as being particularly effective in the detection and acquisition of targets in a high clutter environment.

In the particular area of target acquisition, high resolution, high sensitivity infrared images may be obtained for a scene in which the target is sought. Conventionally, these scenes are acquired using mercury-cadmium-telluride (HgCdTe) detectors which are assembled into long linear arrays. The linear arrays are generally mounted in an evacuated dewar containing liquid nitrogen at 77 degrees Kelvin.

In order to obtain the infrared scene information from the arrays of detectors, the relatively long linear arrays are scanned in the direction perpendicular to their long dimension. The scan data may then be filtered in real time using, for example, a multitapped CCD delay line with weighted summing devices coupled to desired combinations of the taps. See J. T. Carlo and J. E. Hall, "Spatial Filtering Using 3×3 Kernal Convolutions", SPIE, Vol. 178, Smart Sensors (1979) pp. 154–161.

However, conventional spatial filtering techniques require a relatively large number of data transfers to generate the convolution. Furthermore, those are characterized by relatively strict limitations on the speed at which these transfers must take place. Generally, in the prior art, the data-to-be-filtered is brought out of the dewar with one serial CCD array, and then is fed into a much longer serial delay line. For an mxn filter, $n-1$ lines of data must be stored. Where there are r detector elements in the vertical detector array, each data sample undergoes $(n-1)r+m$ shifts at a shift rate of $r/T_d$, where $T_d$ is the detector dwell time. However, due to the long delay lines, the data tends to degrade (or smear) and this smearing gets worse as the delay line gets longer and the transfer rate increases.

It is an object of the present invention to provide an improved spatial filter system.

It is another object to provide a spatial filter system for use in conjunction with detectors within a dewar.

SUMMARY OF THE INVENTION

Briefly, the present invention is directed to a linear spatial filter system for filtering an r row by s column (r×s) matrix of data values using an m row by n column (m×n) spatial operator matrix, where m is less than or equal to r, and n is less than or equal to s. In addition, the m×n spatial operator matrix is the product of a one row by n column (1×n) spatial operator matrix and an m row by one column (m×1) spatial operator matrix.

The system includes a first filter for filtering each row of the data matrix with the 1×n spatial operator matrix to generate an r×s first filtered value matrix. The system further includes a second filter for filtering each column of the first filtered value matrix with the m×1 spatial operator matrix to generate an r×s second filtered value matrix. The latter matrix represents the result of filtering the r×s data value matrix with the m×n spatial operator matrix.

With the present invention, each data point undergoes only n+m transfers, n of which are performed at a rate of $1/T_d$. Thus, a relatively small number of shifts are "fast". More particularly, a conventional spatial filter would require $(n-1)r$ more "fast" shifts than that required by a system of this invention. This differential is significant because, while detector arrays are becoming quite large (200>r>500), data can change significantly after only a few thousand CCD shifts. This fact alone tends to limit the size of the filter to a 5×5 matrix.

In summary, the principal advantages of the present invention are related to the fact that fewer and slower data shifts are required. One advantage is that the quality of the output data is improved since the effects of smearing have been reduced, and larger spatial filters are feasible. Another advantage is that a parallel CCD array may be fabricated out of the same material as the detector array. While this is a highly desirable manufacturing technique, it is not currently used because detector materials usually make poor CCD elements. However, this drawback can be compensated for, at least in part, by a drastic decrease in the required data transfer rate.

While the present invention is particularly useful in the analysis and generation of infrared scenes, where single wire detector outputs offer many material advantages, the invention is generally applicable to any spatial filtering, where the filter operator has the form of a product of two linear matrices.

BRIEF DESCRIPTION OF THE DRAWINGS

The foregoing and other objects of this invention, the various features thereof, as well as the invention itself, may be more fully understood from the following description, when read together with the accompanying drawings in which the FIGURE shows, in schematic form, an exemplary embodiment of the present invention.

DESCRIPTION OF THE PREFERRED EMBODIMENT

Figure 1:
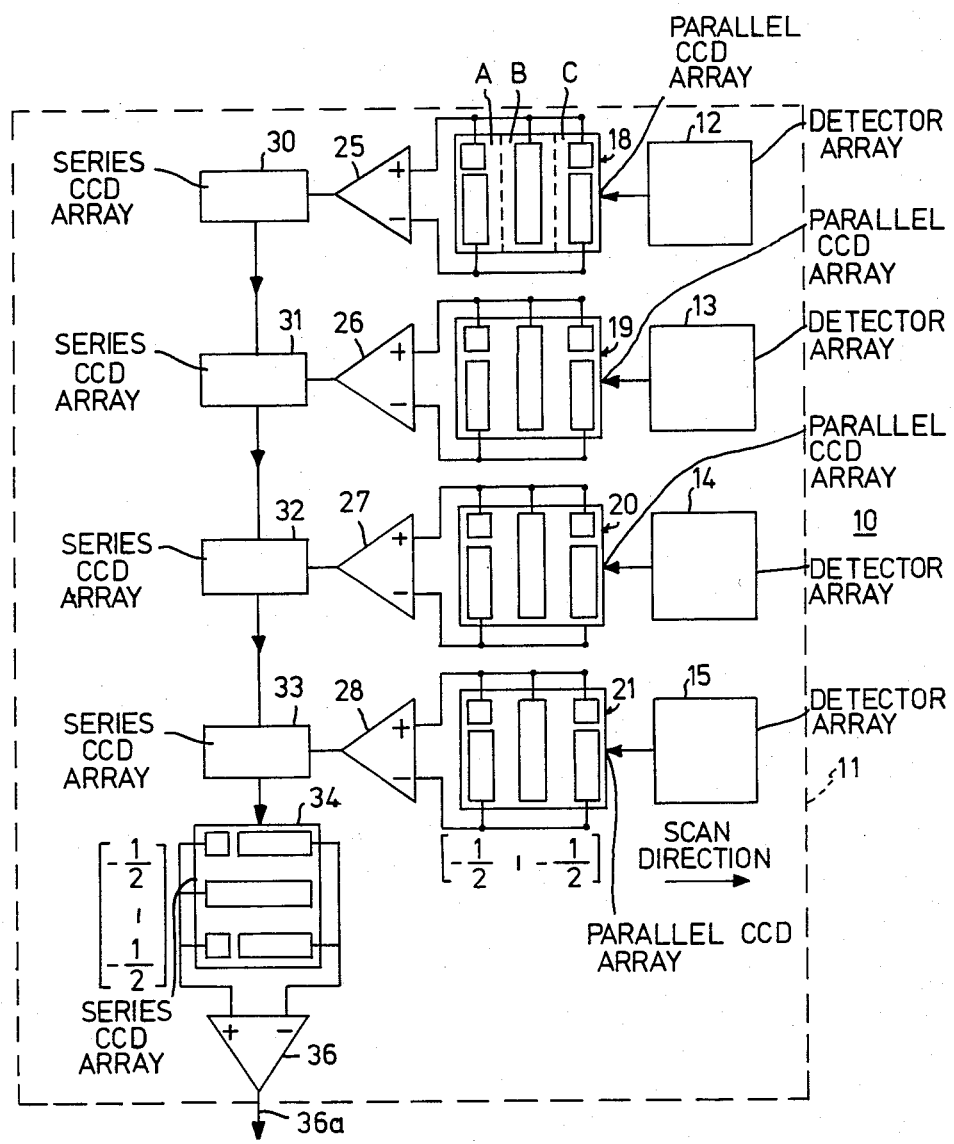

In general, the present invention is suitable for any spatial filter where the operator has the form of the product of two linear matrices. One particular form of spatial filter, a Laplacian filter in the form of a 3×3 fourth derivative operator, has been found to be particularly useful in analyzing data representative of an infrared scene and detecting targets in that scene which occupy less than a single scene pixel, See J. J. Otazo and R. R. Parenti, "Digital Filters For The Detection Of Resolved And Unresolved Targets Embedded In IR Scenes", proceedings of the SPIE Technical Symposium East (April, 1979), Smart Sensors, Vol. 178, p. 13ff. The spatial form of the particular 3×3 fourth derivative operator as cited by Otazo and Parenti is defined by the following matrix:

$$h = \begin{bmatrix} \frac{1}{2} & -\frac{1}{2} & \frac{1}{2} \\ -\frac{1}{2} & 1 & -\frac{1}{2} \\ \frac{1}{2} & -\frac{1}{2} & \frac{1}{2} \end{bmatrix}$$

When this filter mask is applied to the following scene segment:

| | | |
|---|---|---|
| $X_{i-1,j-1}$ | $X_{i,j-1}$ | $X_{i+1,j-1}$ |
| $X_{i-1,j}$ | $X_{i,j}$ | $X_{i+1,j}$ |
| $X_{i-1,j+1}$ | $X_{i,j+1}$ | $X_{i+1,j+1}$ | where the indices i and j represent pixel indices, where i is an integer in the range zero to s and j is an integer in the range zero to r, a filtered pixel value $X_{ij}$ is produced in the following form:

$$X_{i,j} = \begin{matrix} \tfrac{1}{4}X_{i-1,j-1} & -\tfrac{1}{2}X_{i,j-1} & +\tfrac{1}{4}X_{i+1,j-1} \\ -\tfrac{1}{2}X_{i-1,j} & +X_{i,j} & -\tfrac{1}{2}X_{i+1,j} \\ +\tfrac{1}{4}X_{i-1,j+1} & -\tfrac{1}{2}X_{i,j+1} & +\tfrac{1}{4}X_{i+1,j+1} \end{matrix}$$

It is important to note that the particular matrix operator h is equivalent to the product of two linear matrices:

$$h = \begin{bmatrix} \tfrac{1}{4} & -\tfrac{1}{2} & \tfrac{1}{4} \\ -\tfrac{1}{2} & 1 & -\tfrac{1}{2} \\ \tfrac{1}{4} & -\tfrac{1}{2} & \tfrac{1}{4} \end{bmatrix} = \begin{bmatrix} -\tfrac{1}{2} \\ 1 \\ -\tfrac{1}{2} \end{bmatrix} [-\tfrac{1}{2}\ 1\ -\tfrac{1}{2}]$$

The FIGURE shows a hardware implementation of an exemplary system 10 which performs the above filtering operation, where the system 10 is adapted for full inclusion within a dewar 11. The system 10 includes a linear detector array including elements 12-15. The detector array is coupled to a parallel CCD array including elements 18-21. Each of the detector elements 12-15 is coupled to an associated one of elements 18-21. Each of elements 18-21 includes three CCD cells, each of which is split into one or two parts. A single electrode overlies each part of each CCD cell. Thus, each of the elements 18-21 includes three split electrode cells. The electrodes from each of the elements 18-21 are coupled to an associated one of differential amplifiers 25-28. The split electrode configuration for the parallel CCD array is illustrated for element 18 in FIG. 1 either one or two electrodes overlying each of the cells. In the present embodiment, for each of elements 18-21, the three CCD cells are split to provide $[-\tfrac{1}{2}\ 1\ -\tfrac{1}{2}]$ weighting to the three-bit (n-tuple) data in the array, and apply that weighted sum signal to the associated differential amplifier.

The output lines from each of the differential amplifiers are coupled to an associated one of four series-connected elements of a series CCD array including elements 30-34. Elements 30-33 are standard CCD transfer elements (without split electrodes). The structure and techniques for fabrication of CCD arrays, such as elements 30-33, are known by those skilled in the art. See generally, Hobson, *Charge-Transfer Devices* (1978) for a detailed discussion of CCD arrays. Element 33 is coupled to an element 34 which includes a split electrode weighting configuration (similar to elements 18-21) and associated differential amplifier 36. Element 34 also includes three CCD cells having a split electrode configuration including either one or two electrodes overlying the CCD cells. In the present embodiment, the CCD cells of element 34 are split to provide $[-\tfrac{1}{2}\ 1\ -\tfrac{1}{2}]$ weighting to the three-bit (m-tuple) filtered data samples in the underlying cells, and apply that weighted sum signal to the amplifier 36.

The detector array is a conventional linear array of detector elements which is adapted for scanning in the "horizontal" direction, as indicated in FIG. 1. While only four detector elements are shown, the "vertical" length of the array can be arbitrary size. In operation, the output from each detector is clocked at a rate $R_i$ into one of elements 18-21 of the three-stage parallel CCD array which performs the $[-\tfrac{1}{2}\ 1\ -\tfrac{1}{2}]$ filtering operation in the horizontal direction. The data are clocked through this CCD array at a rate equal to the inverse of the detector dwell time $T_d$. Sums of the successive 3-(n-)tuplets in elements 18-21 are generated through the use of the split electrode technique, which is well known in the art, see, for example, G. S. Hobson, "Charge-Transfer Devices", Edward Arnold (1978).

The individual weighted sum (first filtered) signals are applied to the series CCD array where those signals are time division multiplexed at a clock rate of $N/T_d$, where N is the number of elements in the detector array. The series CCD array performs two functions. First, in embodiments where the detector array is located in a dewar, series CCD array it allows the removal of the array data from the dewar in multiplexed form along a single output wire 36a, thereby minimizing the required number of dewar penetrations. In this reading out operation, the data in the series CCD is multiplexed in time which, while reducing the number of output lines, increases the data bandwidth.

The second function of the series CCD array is to perform the $[-\tfrac{1}{2}\ 1\ -\tfrac{1}{2}]$ vertical filtering operation. This is accomplished by the split electrode weighting element configuration. The filtered output on line 36a is a two-dimensional convolution of the original scene with the m×n filter defined above.

While the embodiment of the present invention is particularly directed to fourth derivative processors for filtering and detecting targets in an infrared image scene, i.e. in a remote sensing and acquisition application in which the size and complexity of the signal processor is to be minimized, the device is particularly useful for systems which must handle high data rates. For example, a passive infrared search and track system might use such a linear detector array to scan a very large field of view with a high spatial resolution resulting in data rates in excess of $10^8$ pixels/seconds. The system is useful where the sensor is expandable, for example, in a case where a remotely piloted vehicle might be used to perform surveillance missions behind enemy lines.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

We claim:

1. A spatial filter system for image data processing to enhance an image, the system comprising:
   A. a linear array of detector elements, each detector element generating a column of data values, the array being adapted for scanning along one dimension to generate a succession of rows of data values thereby defining a matrix having a plurality of columns and rows:
   B. a first filter means connected to the array to receive the rows of data values in succession and process the data values of each row in parallel to generate a first-filtered value matrix;

C. a first summing means connected to the first filter means for summing the data values of the first-filtered value matrix to generate a succession of summed data columns from said first-filtered value matrix;

D. a second filter means connected to the first summing means for filtering the summed columns in succession to generate a second filtered value matrix; and E. a second summing means for summing the data values of the second-filtered value matrix, wherein the first and second filter means are chosen such that their multiplicative product form a two-dimensional spatial filter of the original matrix of data values.

2. The system of claim 1 wherein the spatial filter is a Laplacian filter.

3. The system of claim 1 wherein the first and second filter means further comprise split electrode, charge-coupled device arrays and the filtering function is accomplished by weighting of the split electrodes.

4. The system of claim 1 wherein the detector elements comprise infra-red detectors mounted in an evacuated dewar.

5. The system of claim 4 wherein the detector elements further comprise mercury-cadmium-telluride sensors.

6. The system of claim 1 wherein the spatial filter is a Laplacian filter in the form of a fourth derivative operator.

* * * * *